US006885015B2

United States Patent
Wester

(10) Patent No.: US 6,885,015 B2
(45) Date of Patent: Apr. 26, 2005

(54) THERMIONIC-CATHODE FOR PRE-IONIZATION OF AN EXTREME ULTRAVIOLET (EUV) SOURCE SUPPLY

(75) Inventor: Neil Wester, Austin, TX (US)

(73) Assignee: Intel Corporation, Santa Clara, CA (US)

(*) Notice: Subject to any disclaimer, the term of this patent is extended or adjusted under 35 U.S.C. 154(b) by 95 days.

(21) Appl. No.: 10/334,680

(22) Filed: Dec. 30, 2002

(65) Prior Publication Data

US 2004/0135103 A1 Jul. 15, 2004

(Under 37 CFR 1.47)

(51) Int. Cl.[7] .................................................. H01J 1/15
(52) U.S. Cl. ...................... 250/504 R; 313/30; 313/336; 430/6
(58) Field of Search ......................... 250/504 R; 313/30, 313/336; 430/6, 5

(56) References Cited

U.S. PATENT DOCUMENTS

| 4,258,283 A | * | 3/1981 | Brunger et al. ............. 313/336 |
| 4,994,706 A | * | 2/1991 | Leung et al. ................. 313/30 |
| 6,576,380 B1 | * | 6/2003 | Davis et al. .................... 430/5 |

* cited by examiner

Primary Examiner—John R. Lee
Assistant Examiner—Zia R. Hashmi
(74) Attorney, Agent, or Firm—Fish & Richardson P.C.

(57) ABSTRACT

A source of soft x-rays in an Extreme Ultraviolet (EUV) lithography system may include a pre-ionization unit to pre-ionize a source material, e.g., a Xenon plasma. The pre-ionization unit may be integrated with a discharge unit, and may use Lanthanum Hexaboride ($LaB_6$) as a thermionic emitter material.

13 Claims, 3 Drawing Sheets

THERMIONIC-CATHODE FOR PRE-IONIZATION OF AN EXTREME ULTRAVIOLET (EUV) SOURCE SUPPLY

BACKGROUND

The progressive reduction in feature size in integrated circuits (ICs) is driven in part by advances in lithography. ICs may be created by alternately etching material away from a chip and depositing material on the chip. Each layer of materials etched from the chip may be defined by a lithographic process in which light shines through a mask, exposing a photosensitive material, e.g., a photoresist.

The ability to focus the light used in lithography, and hence to produce increasingly smaller line widths in ICs, may depend on the wavelength of light used. Current techniques may use light having a wavelength of about 193 nm. The use of "soft" x-rays (wavelength range of $\lambda \approx 10$ to 20 nm) in lithography is being explored to achieve smaller desired feature sizes. Soft x-ray radiation may also be referred to as extreme ultraviolet (EUV) radiation.

DETAILED DESCRIPTION

Figure 1:
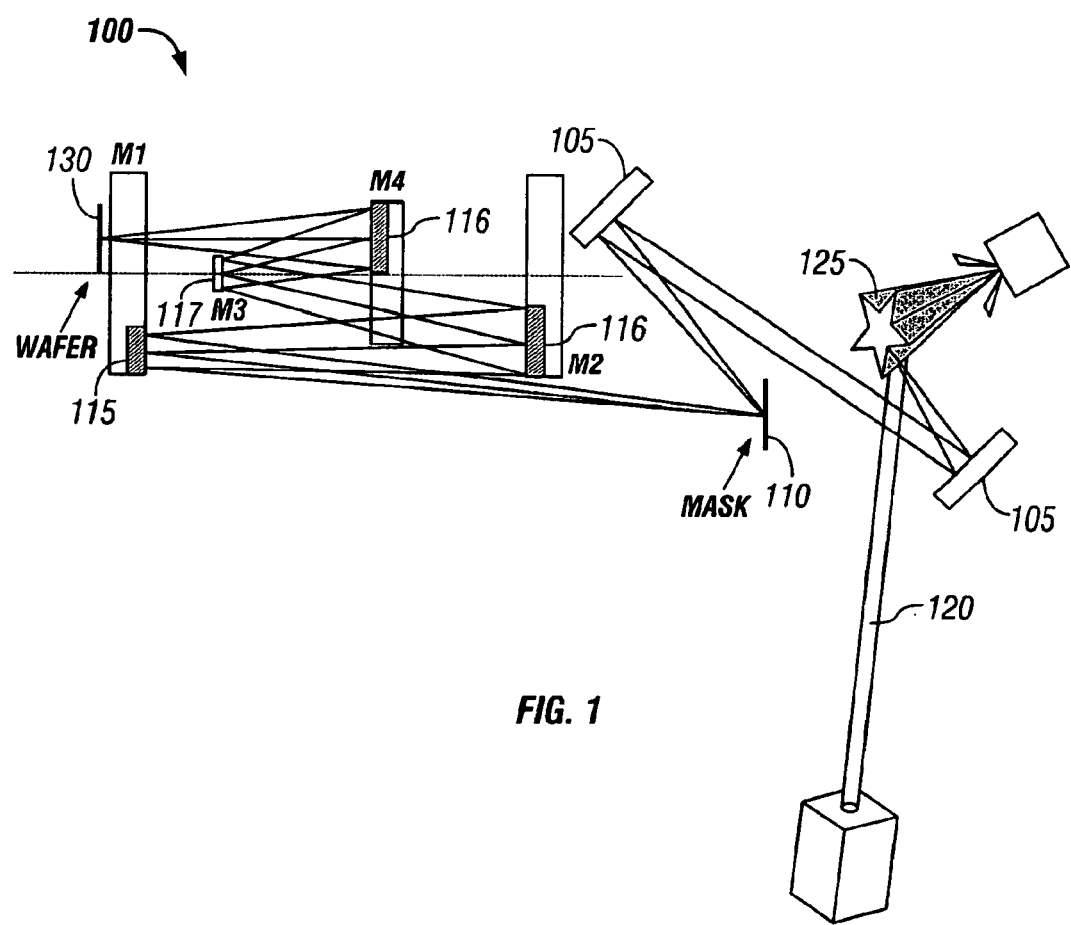
FIG. 1 illustrates an Extreme Ultraviolet (EUV) lithography system according to an embodiment.

FIG. 1 illustrates an Extreme Ultraviolet (EUV) lithography system 100 according to an embodiment. EUV lithography is a projection lithography technique which may use a reduction optical system and illumination in the soft X-ray spectrum (wavelengths in the range of about 10 nm to 20 nm). The system 100 may include a source of soft X-rays, condenser optics 105, a reticle mask 110, and an optical system including four high precision mirrors (M1–M4) 115–118. The efficiency of the lithography system 100 may be reduced due to absorption of EUV light, which may be absorbed in the atmosphere and by many materials. To reduce absorption in the system, the lithography process may be carried out in a vacuum, and a reflective, rather than transmissive, reticle mask 110 may be used.

The source of soft X-rays may be a compact high-average-power, high-repetition-rate laser 120 which impacts a target material 125 to produce broad band radiation with significant EUV emission. The target material may be, for example, a plasma generated from a noble gas, such as Xenon (Xe). The target material may convert a portion of the laser energy into EUV radiation with an energy of about 90 to 100 eV.

The condenser optics 105 may collect EUV light from the source and condition the light to uniformly illuminate the mask 110 and properly fill an entrance pupil of the camera. The condenser 105 may include a series of aspheric mirrors, which collect the radiation and reflect it at a low angle. The mirrors may include multiple layers, such as alternating molybdenum and silicon beryllium layers to produce constructive interference in the direction of reflection.

The radiation from the condenser 105 may be directed to the mask 110. The mask may include a multiple-layer reflecting substrate with a patterned, absorbing overlayer. The reflected EUV radiation from the mask 110 may carry an IC pattern on the mask 110 to a photoresist layer on a wafer 130 via the optical system including multilayer mirrors M1–M4. The entire reticle may be exposed onto the wafer 130 by synchronously scanning the mask and the wafer, e.g., by a step-and-scan exposure.

Figure 2:
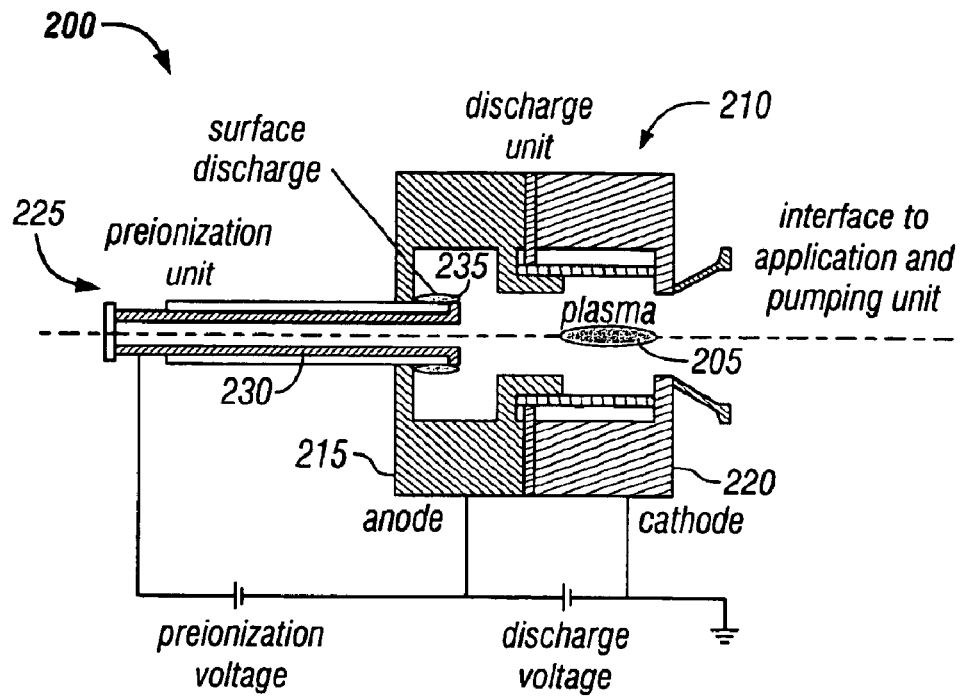
FIG. 2 illustrates a gas discharge plasma source according to an embodiment.

As described above, EUV radiation may be generated by impacting a plasma with a laser. FIG. 2 illustrates a gas discharge plasma source 200 according to an embodiment. The plasma source may generate a plasma 205 from an ionized Xenon gas (or vapor). The plasma may be, e.g., a Z-pinch plasma, a cylindrical plasma which may be established between two electrodes by means of transient electrical discharges. The electric current may heat the plasma and simultaneously produce a Lorentz force which compresses the column.

The plasma 205 may include a gaseous mixture of neutral species, ions, and electrons. A source of electrons, e.g., a discharge unit 210, may provide electrons as electric discharge initiators which strip electrons from the Xenon atoms in the gas to produce Xenon ions.

The discharge source 200 may include a discharge unit 210 including an anode 215 and a cathode 220. The plasma 205 may be produced by applying a high voltage pulse across an anode-cathode gap, which may be filled with gas. The plasma may be imploded by an azimuthal magnetic field produced by an axially flowing discharge current. During compression and stagnation, the kinetic energy may be converted to thermal energy and radiation, and a hot and dense core may be formed at the center of the discharge unit. The plasma 205 may emit radiation in the x-ray regime, including soft x-ray, or EUV, radiation. This radiation may be filtered for a desired wavelength for use in the lithography system 100.

The Xenon ions in the plasma may have charges of, e.g., 9+ or 14+. To generate the plasma, a number of electrons (e.g., nine to fourteen) may be stripped from Xenon particles in the gas stream. This operation may require a significant amount of energy, and consequently, generate a significant amount of heat. To reduce the amount of energy required to produce such ions, the ionization may be performed in stages.

The first ionization stage may be performed by a pre-ionization unit 22S integrated into the discharge source 210. The pre-ionization cathode 230 may include a cathode 230 with a thermionic emission material 235 on its surface. The thermionic emission material, e.g., Lanthanum Hexaboride (LaB$_6$), may be used as an electron source which emits electrons from its surface with the application of heat. The electron flux from the surface of the cathode pre-ionizes source gas (e.g., Xe) being transported through or across the cathode surface. The number of electrons generated may be controlled by varying a pre-ionization voltage. A pre-ionization of the gas may occur through collisions of the cathode emitted electrons with the gas species.

The current density emitted by the thermionic emission material may be described by the Richardson-Dishman equation:

$$J(T) = A\, T^2 \exp(-\Phi/kT)$$

where
A=Pre-exponential constant
T=temperature
K–Boltzman's constant
Φ=surface work function.

The work function represents the amount of energy an electron needs to overcome to be emitted from the material's surface. A good thermionic emitter may be characterized by a combination of a low surface work function and a high operating temperature, e.g., have a high melting point. Hover, higher melting point materials typically have higher work functions.

Lanthanum Hexaboride has a relatively low work function ($\Phi$=2.3–3.4 eV) compared to other high-temperature stable materials, such as Tungsten (W) ($\Phi$=4.5 eV). The thermionic emission material may be single crystal Lanthanum Hexaboride (LaB$_6$) material, and may have a crystallographic orientation of (100), which has a work function of about 2.66 eV.

Figure 3:
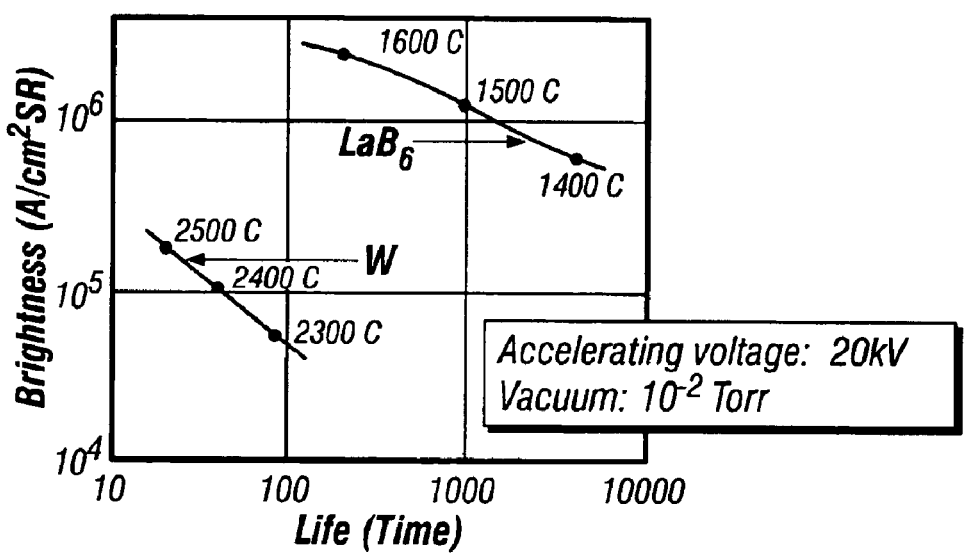
FIG. 3 is a graph describing the relation between life and brightness of Tungsten and Lanthanum Hexaboride.

The plasma may have very energetic ions, e.g., with energies between about 90 eV and 100 eV. Hence, the material used for the cathode electrode may be exposed to very high temperatures. Lanthanum Hexaboride is robust with respect to high temperature vacuum environments, as shown in FIG. 3.

The source and condenser optics 105 may be a closed system. The condenser optics may be very sensitive to contamination. For example, one or two monolayers of contamination may reduce reflectivity below an acceptable tolerance level. Debris may be produced in higher work function materials due to chunks of material being pulled off or melting of the material due to high voltage potential at the surface of the emission material. The (100) crystalline Lanthanum Hexaboride material may produce less debris in the source due to its lower work function, which enables the material to easily release electrons.

Figure 4:
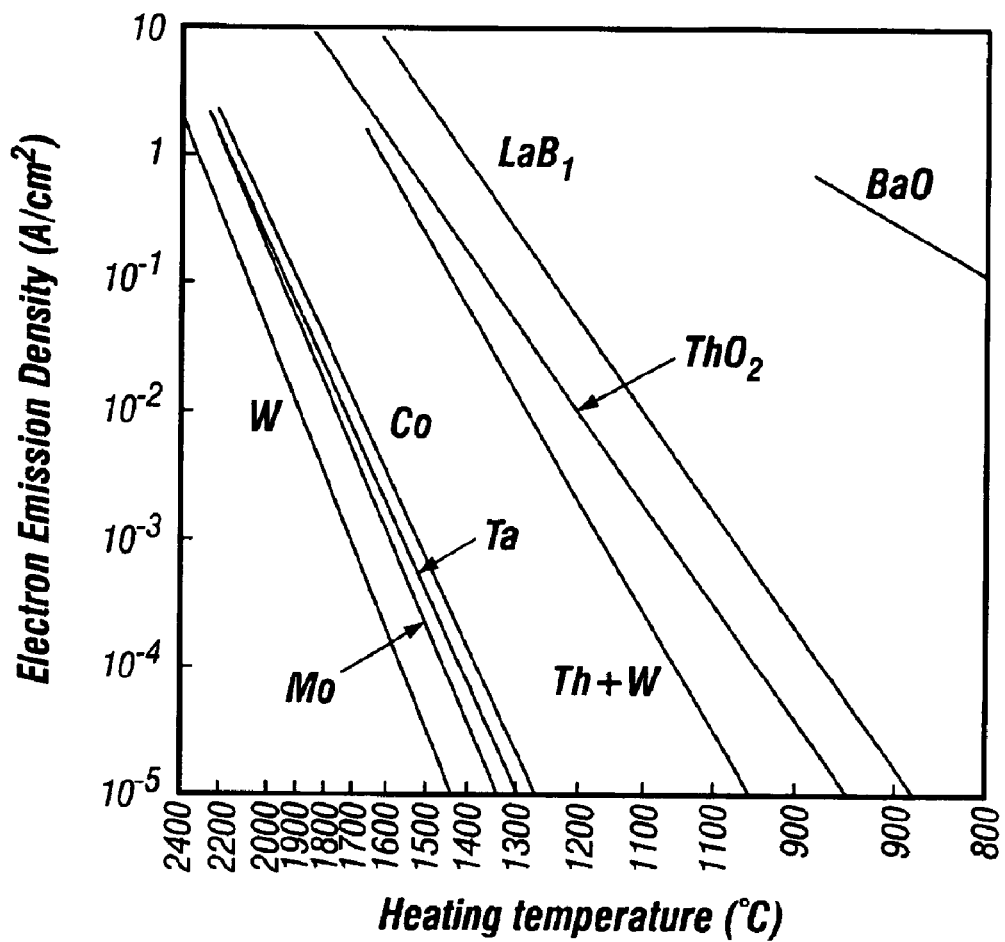
FIG. 4 is a graph describing the relationship between heating temperature and electron emission density of thermionic cathode materials.

As shown in FIG. 4, Lanthanum Hexaboride emits electrons of a controlled number density and energy based on temperature. A feedback control system may be used to precisely control electron emission from the thermionic material. Also, the ability of the monolithic cathode to independently control supply of pre-ionization electrons may reduce debris from the source insulator and anode.

A number of embodiments have been described. Nevertheless, it will be understood that various modifications may be made without departing from the spirit and scope of the invention. Accordingly, other embodiments are within the scope of the following claims.

What is claimed is:

1. A method comprising:
   pre-ionizing a source material with a thermionic emitter comprising a single crystal Lanthanum Hexaboride (LaB6) material having a (100) crystallographic orientation;
   ionizing the source material to a desired ionization state; and
   generating a plasma from the source material, said plasma emitting an extreme ultraviolet radiation.

2. The method of claim 1, wherein said pre-ionizing the source material comprises heating a thermionic emission material having a work function less than about 2.7 eV.

3. The method of claim 1, wherein said generating a plasma comprises generating a plasma emitting radiation including a wavelength in the range of about 10 nm to about 20 nm.

4. The method of claim 1, further comprising:
   guiding said extreme ultraviolet radiation to a photoresist material on a substrate; and
   exposing the photoresist material with at least a portion of said extreme ultraviolet radiation.

5. The method of claim 1, wherein the source material comprises a noble gas.

6. A source of extreme ultraviolet radiation comprising:
   a pre-ionization cathode including a thermionic emission material comprising a single crystal Lanthanum Hexaboride (LaB6) material having a (100) crystallographic orientation;
   an anode; and
   a pre-ionization voltage supply operative to generate a voltage between the pre-ionization cathode and the anode sufficient to pre-ionize a source material.

7. The source of claim 6, further comprising:
   a discharge cathode; and
   a discharge voltage supply operative to generate a voltage between the anode and the discharge cathode sufficient to generate a plasma from a pre-ionized source material.

8. The source of claim 7, wherein said plasma emits radiation in the extreme ultraviolet spectrum.

9. The source of claim 7, wherein said plasma emits radiation in a range of about 10 nm to about 20 nm.

10. The source of claim 6, wherein the thermionic emission material has a work function of less than about 2.7 eV.

11. A system comprising:
    a source of extreme ultraviolet radiation including a pre-ionization module operative to pre-ionize a source material, the pre-ionization module including a thermionic emitter comprising a single crystal Lanthanum Hexaboride (LaB6) material having a (100) crystallographic orientation;
    a substrate having a surface including a photoresist material; and
    a plurality of mirrors operative to direct at least a portion of the extreme ultraviolet radiation toward the photoresist material.

12. The system of claim 11, wherein the thermionic emission material has a work function of less than about 2.7 eV.

13. The system of claim 11, further comprising a filter operative to filter a wavelength in the range of from about 10 nm to about 20 nm from the extreme ultraviolet radiation.

* * * * *